United States Patent [19]
Ichikawa et al.

[11] Patent Number: 5,956,574
[45] Date of Patent: Sep. 21, 1999

[54] LEAD FRAME FLASH REMOVING METHOD AND APPARATUS

[75] Inventors: Seiji Ichikawa; Junichi Tanaka; Tomoaki Hirokawa; Taku Sato; Tomoaki Kimura; Satoshi Murata; Tsutomu Kubota; Takeo Ogihara; Kenji Uchida; Kenji Watanabe; Tsutomu Noguti, all of Tokyo, Japan

[73] Assignee: NEC Corporation, Tokyo, Japan

[21] Appl. No.: 08/808,420

[22] Filed: Feb. 28, 1997

[30] Foreign Application Priority Data

Mar. 5, 1996 [JP] Japan .................................. 8-047196

[51] Int. Cl.$^6$ ........................... H01L 21/44; H01L 21/48; H01L 21/50

[52] U.S. Cl. .......................... 438/106; 438/110; 438/120; 438/121

[58] Field of Search .................................. 438/106, 110, 438/120, 121

[56] References Cited

U.S. PATENT DOCUMENTS

| | | | |
|---|---|---|---|
| 5,318,926 | 6/1994 | Dlugokecki | 437/210 |
| 5,480,607 | 1/1996 | Hobson . | |
| 5,700,366 | 12/1997 | Steblianko et al. . | |
| 5,766,649 | 6/1998 | Azuma . | |

FOREIGN PATENT DOCUMENTS

| | | |
|---|---|---|
| 0430623 | 6/1991 | European Pat. Off. . |
| 496238 | 3/1992 | Japan . |
| 533543 | 12/1993 | Japan . |

OTHER PUBLICATIONS

Patent Abstracts of Japan, vol. 008, No. 136 (M–304), Jun. 23, 1984.
Patent Abstracts of Japan, vol. 006, No. 144 (E–122), Aug. 3, 1982.
Patent Abstracts of Japan, vol. 010, No. 352 (E–458), Nov. 27, 1986.
Patent Abstracts of Japan, vol. 016, No. 324 (E–1234), Jul. 15, 1992.
Patent Abstracts of Japan, vol. 016, No. 095 (E–1175), Mar. 9, 1992.
Patent Abstracts of Japan, vol. 012, No. 322 (E–652), Aug. 31, 1988.

*Primary Examiner*—Kevin M. Picardat
*Assistant Examiner*—D. Mark Collins
*Attorney, Agent, or Firm*—Sughrue, Mion, Zinn, Macpeak & Seas, PLLC

[57] ABSTRACT

In a lead frame flash removing method and apparatus, a lead frame is molded integrally with a case. After molding, abrasive agent-mixed water is sprayed to a surface of the lead frame where a flash is formed. The lead frame is dipped in an electrolytic solution and applying a DC voltage is applied across the lead frame and an electrode in the electrolytic solution, thereby electrolytically processing the lead frame. After the electrolytic process, an external force is applied to the surface of the lead frame, thereby removing the flash.

6 Claims, 4 Drawing Sheets

LEAD FRAME FLASH REMOVING METHOD AND APPARATUS

BACKGROUND OF THE INVENTION

The present invention relates to a lead frame flash removing method and apparatus for removing a flash formed when molding a resin portion integrally with a lead frame.

Ultra-high frequency devices include a transistor, an IC, an optical element, a surface acoustic wave element, a resonator, and the like. In such an ultra-high frequency device, as the package becomes large, the inductance component of the lead is increased, and the loss in a high frequency band is increased. Therefore, the ultra-high frequency device must be stored in a very small package having a diameter of about 2 mm. Conventionally, the ultra-high frequency device is incorporated in a hollow ceramic package. As the ceramic package is expensive, the ultra-high frequency device tends to be incorporated in a resin mold package.

Conventionally, when a package is molded from a resin, after molding, a flash is formed on the lead frame. To remove this flash, the following methods are available, e.g., a honing method of spraying an abrasive agent mixed in an air flow or water flow, and an electrolytic method of dipping the lead frame in an alkali solution as an electrode, and performing electrolytic process, so that bubbles are generated from the lead frame, thereby floating the flash from the surface of the lead frame.

In the conventional flash removing methods described above, a problem occurs when a relatively thick flash is formed. More specifically, when removing a thick flash by the honing method, since the spraying pressure must be increased, the surface of the molded portion is undesirably ground with the abrasive agent. Also, the adhesive properties between the lead frame and the mold are decreased, or the mold case may be undesirably disconnected from the lead frame. When removing a thick flash by the electrolytic method, since the electrolytic solution is difficult to permeate between the flash and the lead frame, a time required by the electrolytic process becomes very long, thus decreasing the efficiency.

In a method of this type, since the processing efficiency is a very significant factor, it is not advantageous to remove all the flashes from the lead frame by the electrolytic process, and it is better to remove flashes remaining after the electrolytic process by another scheme. However, since the flashes remaining after the electrolytic process often firmly adhere to the lead frame, they cannot be removed easily. For example, as shown in Japanese Patent Laid-Open No. 4-96238, when a method of blowing off the flashes remaining after the electrolytic process is employed, the water pressure must be very high.

A conventional flash removing method of removing a flash by the electrolytic method will be described with reference to FIGS. 4 to 10. FIGS. 4 to 10 show the respective steps until an RF device is formed from a lead frame. Referring to FIG. 4, a lead frame 1 is used to manufacture an RF device. An island 2 for mounting a chip (to be described later) thereon, inner leads 3 to be wire-bonded and connected to the chip electrodes, and outer leads 4 extending to the outside are integrally formed in the lead frame 1.

Referring to FIG. 5, reference numeral 5 denotes a molding die used for molding the case portion of a hollow package on the lead frame 1. The molding die 5 is constituted by a lower die 6 supporting the lead frame 1, and an upper die 7 cooperating with the lower die 6 to sandwich the lead frame 1. A cavity 8 of the molding die 5 is formed by forming a recessed portion 6a having a square opening in the upper surface of the lower die 6 and by forming a recessed portion 7a defining a square opening in the lower surface of the upper die 7. A molding resin flows into the cavity 8 through a runner 6b and a gate 6c formed in the lower die 6.

Referring to FIG. 6, reference numeral 9 denotes the case of a hollow package molded integrally with the lead frame 1. Reference numerals 16 and 17 denote flashes generated to attach to the surface of the lead frame 1. Referring to FIG. 7, an electrolytic process carbon electrode 12 connected to the anode of a power supply, and the lead frame 1 connected to the cathode of the power supply are dipped, together with the package 9, in an electrolytic solution 11 stored in an electrolytic cell 10. In the flash removing method described in Japanese Patent Laid-Open No. 4-96238, a 5% aqueous NaOH solution is used as the electrolytic solution 11, and is heated to 50° C.

Referring to FIG. 8, reference numerals 13 denote nozzles for injecting water 13a. Referring to FIG. 9, reference numeral 18 denotes an RF chip; and 19, bonding wires. Referring to FIG. 10, reference numeral 14 denotes the cap of a hollow package. The cap 14 is adhered, with an adhesive material 15, to the upper surface of the package 9 formed by molding.

The steps in manufacturing an RF device by using the lead frame 1 shown in FIG. 4 will be described. First, as shown in FIG. 5, the lead frame 1 is inserted in the molding die 5 to perform molding. Molding is performed by flowing a molten epoxy resin from the runner 6b into the cavity 8 through the gate 6c and solidifying it as it fills the cavity 8. The liquid epoxy resin flows into the recessed portion 7a of the upper die 7 of the cavity 8 through the gap between the inner and outer leads 3 and 4 of the lead frame 1.

The island 2 and the inner leads 3 of the lead frame 1 are not supported by the lower die 6, but are supported by their own rigidity at positions where they come in contact with the lower surface of the upper die 7. Thus, the liquid epoxy resin also enters the gap between the island 2 and the upper die 7, and between the inner leads 3 and the upper die 7. After the entered epoxy resin solidifies, it forms thick flashes to remain. The liquid epoxy resin enters, although slightly, also portions around the cavity 8 and between the lead frame 1 and the upper die 7 and between the lead frame 1 and the lower die 6.

After molding, the lead frame 1 is extracted from the molding die 5, as shown in FIG. 6, thereby obtaining the lead frame 1 molded integrally with the case 9. A square frame portion 9a is formed, to be integral with this case 9, from the epoxy resin solidified in the recessed portion 7a of the upper die 7. The island 2 and part of the inner leads 3 are exposed to the bottom surface of the recessed portion surrounded by the frame portion 9a as they are covered with the flashes 16. The flashes 17 also attach to the upper and lower surfaces of the proximal end portions of the outer leads 4 projecting from the case 9.

The lead frame 1 is dipped in the electrolytic cell 10, as shown in FIG. 7, and a DC voltage is applied across the lead frame 1 and the carbon electrode 12, thereby electrolytically processing the lead frame 1. At this time, the lead frame 1 is set as the cathode. When the electrolytic process is performed in this manner, hydrogen bubbles are generated from the lead frame 1 to form gaps between the lead frame 1 and the flashes 16, and between the lead frame 1 and the flashes 17. As a result, part of the flashes 16 and 17 are separated from the lead frame 1.

After the electrolytic process, the water 13a is injected to the upper and lower surfaces of the lead frame 1 from the nozzles 13, as shown in FIG. 8. By this water injection, flashes 16a and 17a remaining after the electrolytic process are blown off from the lead frame 1 and are thus removed. The flashes 16a and 17a remaining after the electrolytic process firmly attach to the lead frame 1. To remove the flashes 16a and 17a completely, the pressure of injected water is set to 300 kg/cm² in the method shown in Japanese Patent Laid-Open No. 4-96238.

Thereafter, as shown in FIG. 9, the RF chip 18 is bonded to the island 2 of the lead frame 1, and the electrodes (not shown) of the RF chip 18 and the inner leads 3 are electrically connected through the bonding wires 19.

The flashes 16 and 17 must be completely removed from the island 2 and the inner leads 3 in the water injecting step described above so that the flashes 16 and 17 will not remain on them. If the flashes 16 and 17 remain on the island 2, the resistance between the ultra-high frequency device, e.g., the chip 18, and the island 2 is increased, thereby degrading the electrical characteristics. If the flashes 16 and 17b remain on the inner leads 3, the bonding strength is decreased, thus degrading the reliability.

After bonding, as shown in FIG. 10, the cap 14 is adhered to the frame portion 9a of the case 9, the outer leads 4 are cut at predetermined positions, and the resultant structure is subjected to molding, thereby manufacturing the RF device in which the RF chip 18 is hermetically sealed with the case 9 and the cap 14.

As described above, in the conventional flash removing method, in removing the flashes 16 and 17 formed on the surface of the lead frame 1, if all the flashes 16a and 17a remaining after the electrolytic process are to be blown off with the water pressure, the water to be injected must be pressurized to a high pressure of about 300 kg/cm². Therefore, a large-sized pressurizing unit for obtaining a high water pressure becomes necessary, and the cost of flash removing is thus increased.

Conventionally, since the package is large, no problem particularly occurs even if high-pressure water is injected. However, it is difficult to apply the same method to an ultra-high frequency package. More specifically, an ultra-high frequency package is hollow and very small, and its case 9 and lead frame 1 are connected to each other with only a resin portion of about 0.4 mm. Accordingly, if high-pressure water is injected to such an ultra-high frequency package, the case 9 may be blown off from the lead frame 1 with the water pressure, or the resin adhesive properties between the lead frame 1 and the case 9 are decreased, leading to a decrease in yield and reliability.

Still another flash removing method employing dry blasting is disclosed in Japanese Patent Laid-Open No. 5-335434. According to this method, an alumina grinding material is sprayed to the flash for 5 seconds to perform sand blasting. With this method, the damage to the case and the lead frames is large to satinize their surfaces. Then, when a chip is mounted, the obtained electrical characteristics are degraded. Since a solid matter is directly used as the abrasive agent, it clogs the pipe, and a process unit for collecting dust after spraying becomes necessary.

SUMMARY OF THE INVENTION

It is an object of the present invention to, provide a lead frame flash removing method and apparatus capable of removing a flash of a lead frame easily at a low cost.

In order to achieve the above object, according to the present invention, there is provided a lead frame flash removing method comprising the steps of molding a lead frame integrally with a resin portion, after molding, spraying abrasive agent-mixed water to a surface of the lead frame where a flash is formed, dipping the lead frame in an electrolytic solution and applying a DC voltage across the lead frame and an electrode in the electrolytic solution, thereby electrolytically processing the lead frame, and after the electrolytic process, applying an external force to the surface of the lead frame, thereby removing the flash.

DESCRIPTION OF THE PREFERRED EMBODIMENT

A lead frame flash removing method and apparatus according to the present invention will be described in detail with reference to the accompanying drawings.

Figure 1:
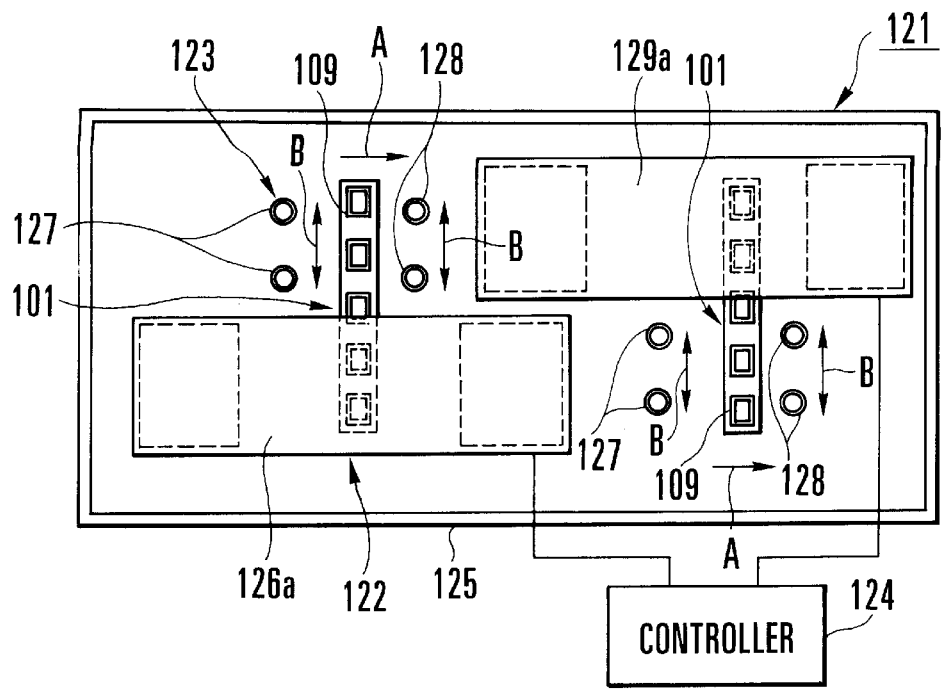
FIG. 1 is a plan view of a lead frame flash removing apparatus according to an embodiment of the present invention.

Referring to FIG. 1, reference numeral 121 denotes a flash removing apparatus. The flash removing apparatus 121 is constituted by a convey unit 122, an injection unit 123, and a controller 124. The convey unit 122 horizontally conveys a lead frame 101 molded integrally with a case 109 in the direction of an arrow A. The injection unit 123 sprays abrasive agent-mixed water obtained by mixing an abrasive agent in water to the lead frame 101 during conveyance. The controller 124 controls the convey unit 122. The flash removing apparatus 121 also has a recovery tank 125 at its lower portion to recover the abrasive agent-mixed water and the removed flash.

Figure 2:
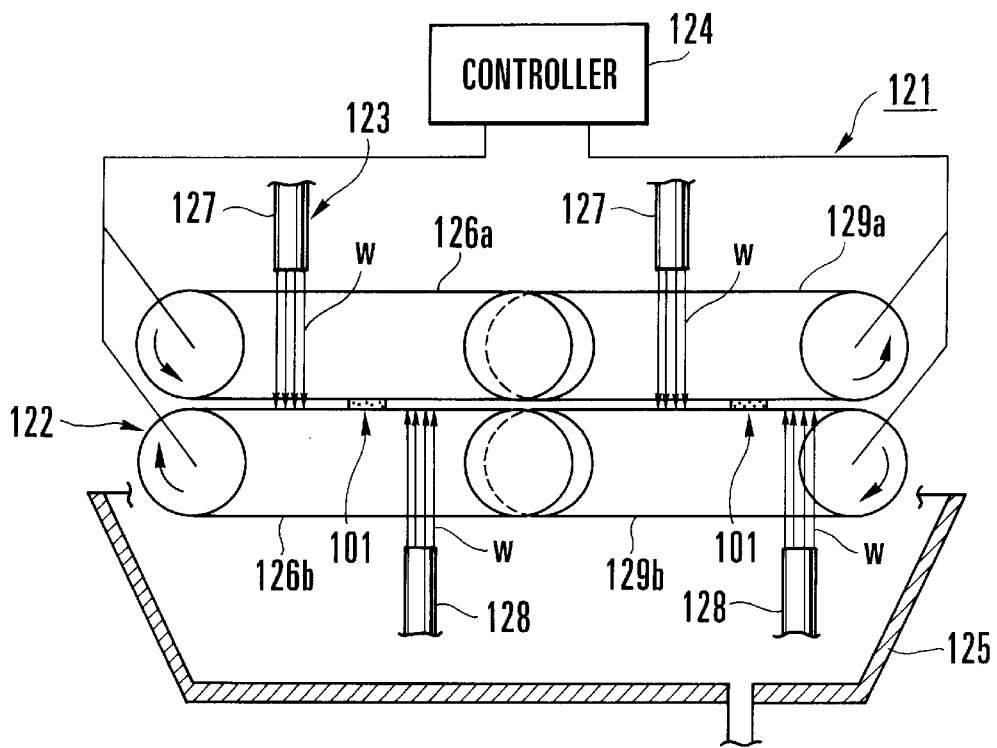
FIG. 2 is a front view of the flash removing apparatus shown in FIG. 1.

As shown in FIG. 2, the convey unit 122 conveys the molded lead frames 101 by sandwiching their major surfaces between its sets of upper and lower pairs of belt conveyors 126a and 126b, and 129a and 129b having different rotating directions. As shown in FIG. 1, the upstream belt conveyors 126a and 126b convey each lead frame 1 by sandwiching its half in the longitudinal direction such that its remaining half projects aside from the belt conveyors 126a and 126b.

As shown in FIG. 2, the downstream belt conveyors 129*a* and 129*b* are disposed on the projecting side of the lead frame 101 conveyed by the upstream belt conveyors 126*a* and 126*b* such that upstream end portions (rollers) of belt conveyors 129*a* and 129*b* substantially overlap the downstream end portions (rollers) of the upstream belt conveyors 126*a* and 126*b* when seen from the side. More specifically, the belt conveyors 126*a* and 126*b*, and 129*a* and 129*b* are arranged to convey the lead frames 101 by alternately sandwiching their halves.

With this arrangement, the lead frame 101 which has been conveyed to the downstream end portions of the upstream belt conveyors 126*a* and 126*b* can be directly transferred to the downstream belt conveyors 129*a* and 129*b*. When the downstream belt conveyors 129*a* and 129*b* convey the lead frame 101, its portion sandwiched by the upstream belt conveyors 126*a* and 126*b* projects aside from the downstream belt conveyors 129*a* and 129*b*.

The injection unit 123 has a plurality of upper nozzles 127 and lower nozzles 128 for spraying the abrasive agent-mixed water, obtained by mixing an abrasive agent in water, at a predetermined flow rate. The spray direction of the upper nozzles 127 is directed downward, while the spray direction of the lower nozzles 128 is directed upward. In FIG. 2, the abrasive agent-mixed water sprayed from the upper and lower nozzles 127 and 128 is denoted by reference symbols W.

Two pairs of upper and lower nozzles 127 and 128 are disposed beside the upstream and downstream belt conveyors 126*a* and 126*b*, and 129*a* and 129*b*, respectively. The upstream and downstream nozzles 127 and 128 are arranged on the same convey line of the lead frames 101. The upper nozzles 127 are arranged upstream the lower nozzles 128 in the convey direction of the lead frames 101. The nozzles 127 and 128 spray the abrasive agent-mixed water W to the projecting portions of the lead frames 101 during conveyance from above and below, respectively.

The nozzles 127 and 128 are coupled to a drive unit (not shown) and are reciprocally driven in the directions of arrows B (the widthwise direction of the belt conveyors 126*a* and 126*b*, and 129*a* and 129*b*) perpendicular to the convey direction of the lead frames 101. When driving the nozzles 127 and 128, they are not limited to be reciprocally moved merely linearly, but can be reciprocally moved to draw an arc.

In addition, the flow rate of the abrasive agent-mixed water W sprayed from the nozzles 127 and 128 is set to the minimum value with which the abrasive agent will not stay midway along the pipe that guides the abrasive agent-mixed water W to the nozzles 127 and 128. Therefore, when the abrasive agent-mixed water W is sprayed to the case 109 of the lead frame 101, the surface of the case 109 can be prevented from being ground.

The controller 124 controls the convey speed of the lead frames 101 conveyed by the convey unit 122 and sets it to a desired convey speed. More specifically, even if the flow rate of abrasive agent-mixed water W sprayed from the nozzles 127 and 128 is constant, the spray amount of abrasive agent-mixed water W is decreased relatively by increasing the convey speed of the lead frames 101.

Figure 4:
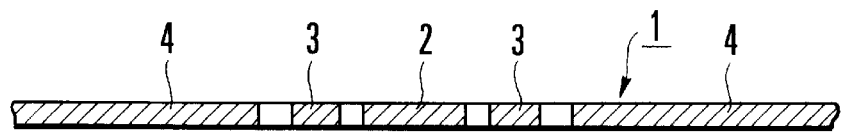
FIG. 4 is a sectional view of the lead frame.
Figure 5:
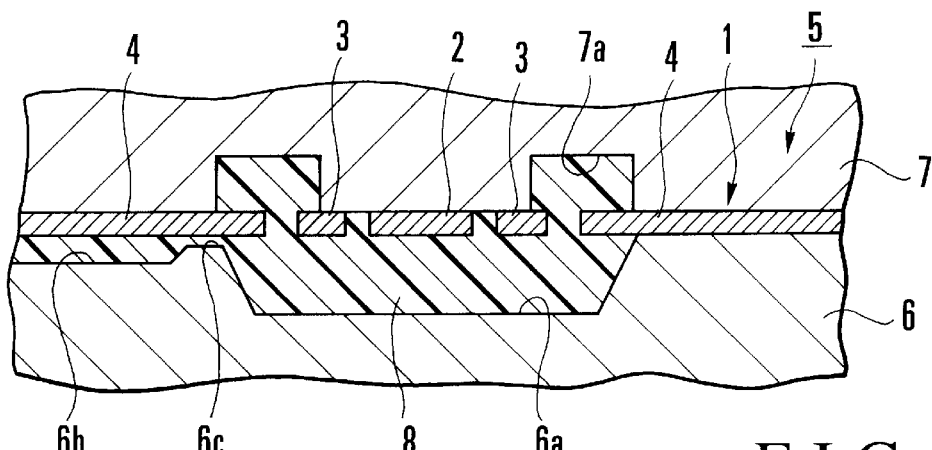
FIG. 5 is a sectional view showing a state wherein a case and a lead frame are molded.
Figure 6:
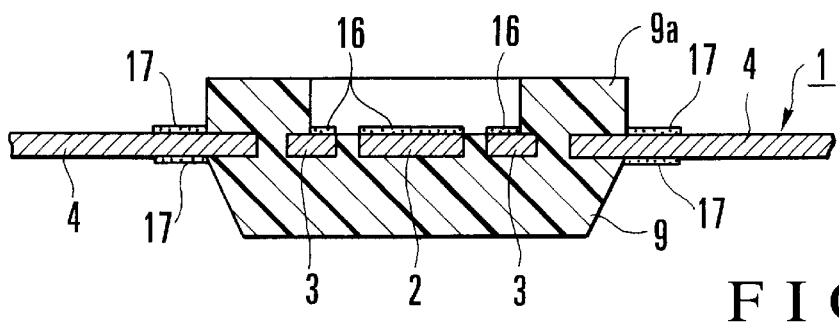
FIG. 6 is a sectional view showing a lead frame molded integrally with the case.
Figure 7:
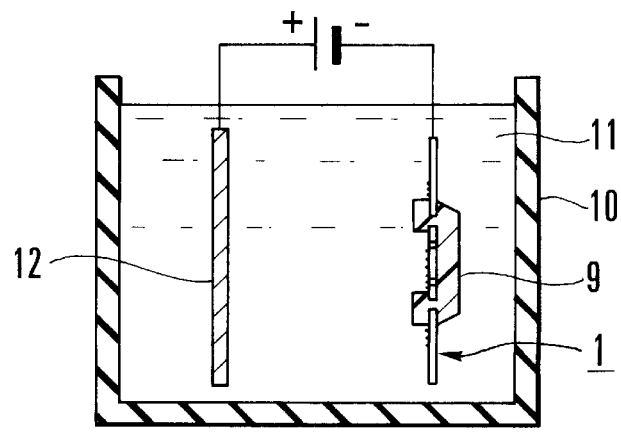
FIG. 7 is a sectional view showing a state wherein a conventional electrolytic process for a lead frame is performed.
Figure 8:
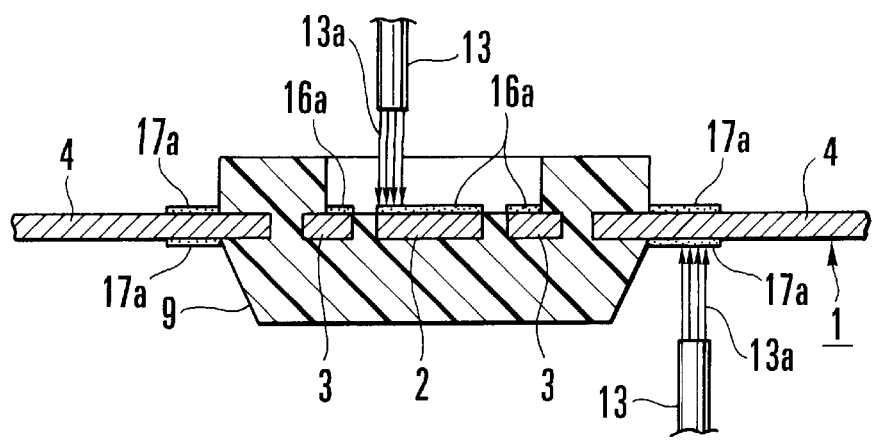
FIG. 8 is a sectional view showing a state wherein, after the conventional electrolytic process is performed, the flashes are blown off with water.
Figure 9:
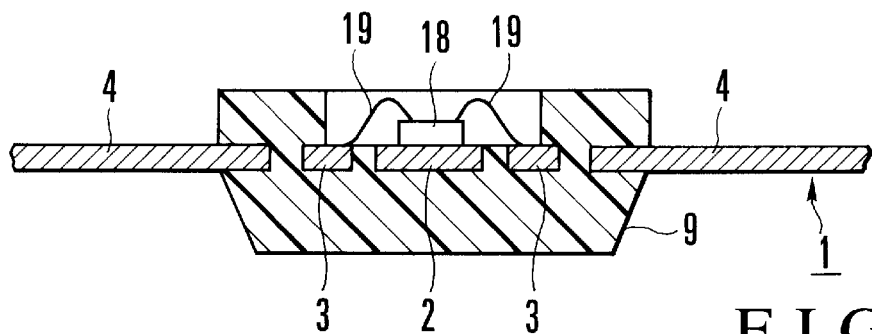
FIG. 9 is a sectional view of a device showing a state wherein a chip is mounted in a conventional case.
Figure 10:
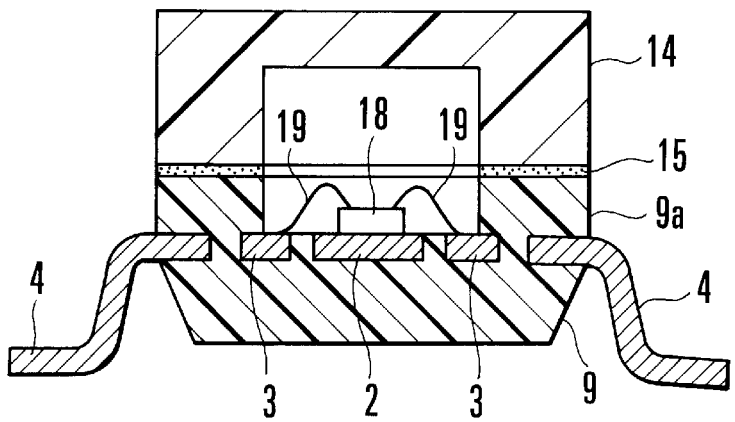
FIG. 10 is a sectional view of a completed device in which a cap is adhered to the conventional case and the outer lead portions are bent.

The lead frame flash removing operation of the flash removing apparatus having the above arrangement will be described. First, the lead frame 101 and the case 109 are integrally molded by insertion molding or the like in accordance with the same scheme as that shown in FIGS. 4 to 6, and the lead frame 101 extracted from the molding die is supplied to the flash removing apparatus 121. At this time, flashes are formed on the surfaces of the molded lead frame 101.

The lead frame 101 supplied to the flash removing apparatus 121 is inserted between the upstream belt conveyors 126*a* and 126*b* such that its half in the longitudinal direction projects aside. At this time, the convey speed of the lead frame 101 conveyed by the upstream and downstream belt conveyors 126*a* and 126*b*, and 129*a* and 129*b* is controlled by the controller 124 to be relatively faster than in the second conveyance (to be described later). Before inserting the lead frame 101 between the upstream belt conveyors 126*a* and 126*b*, the nozzles 127 and 128 of the injection unit 123 are reciprocally driven to spray the abrasive agent-mixed water W, thus making a preparation.

Figure 3A:
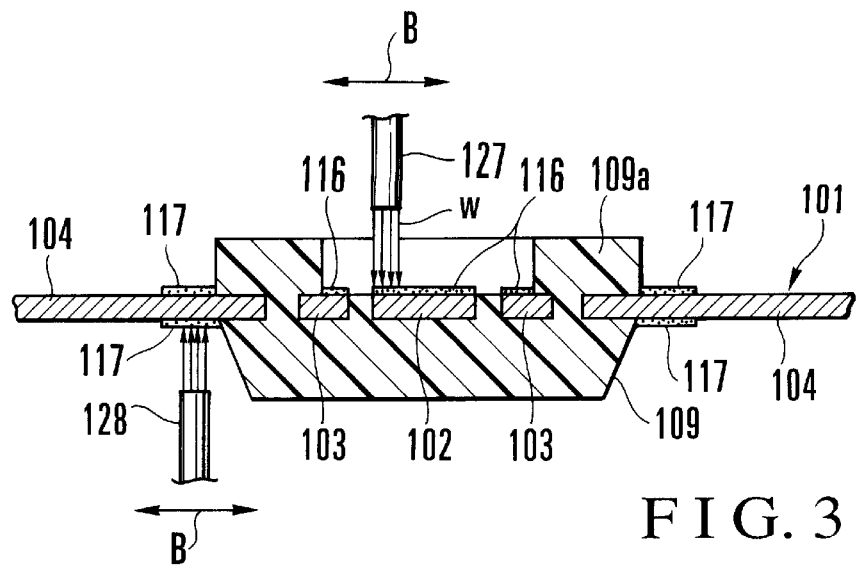
FIGS. 3A to 3C are views for explaining a flash removing operation performed by the flash removing apparatus shown in FIG. 1.

When the lead frame 101 is conveyed as it is sandwiched by the upstream belt conveyors 126*a* and 126*b*, the abrasive agent-mixed water W supplied from the upper nozzles 127 is sprayed to the projecting portion of the lead frame 101 from above, and subsequently the abrasive agent-mixed water W from the lower nozzles 128 is sprayed to this portion from below. FIG. 3A shows a state wherein the abrasive agent-mixed water W supplied from the nozzles 127 and 128 is sprayed to the lead frame 101.

At this time, since the nozzles 127 and 128 are reciprocally driven in the widthwise direction of the belt conveyors 126*a* and 126*b*, i.e., in the directions of the arrows B perpendicular to the convey direction of the lead frame 101, the abrasive agent-mixed water W is sprayed to the entire upper and lower surfaces of the projecting portion of the lead frame 101 during conveyance.

When the lead frame 101 is conveyed to the downstream end portions of the upstream belt conveyors 126*a* and 126*b*, the projecting portion of the lead frame 101 is sandwiched between the downstream belt conveyors 129*a* and 129*b*. Hence, the lead frame 101 is conveyed by the downstream belt conveyors 129*a* and 129*b* as its half sandwiched by the upstream belt conveyors 126*a* and 126*b* projects.

When the downstream belt conveyors 129*a* and 129*b* start conveyance of the lead frame 101, the abrasive agent-mixed water W supplied from the upper nozzles 127 is sprayed to the half of the lead frame 101 which projects from the downward belt conveyors 129*a* and 129*b*, and subsequently the abrasive agent-mixed water from the lower nozzles 128 is sprayed to it. Thus, the abrasive agent-mixed water W is sprayed to the entire upper and lower surfaces of the projecting portion of the remaining half of the lead frame 101.

In this manner, when the lead frame 101 is supplied to the convey unit 122 while the injection unit 123 is being driven, the abrasive agent-mixed water W is sprayed to the entire upper and lower surfaces of the lead frame 101.

In the first conveyance described above, as shown in FIG. 3A, the convey speed of the lead frame 101 is controlled so that, when the abrasive agent-mixed water W is sprayed to flashes 116 and 117, it is sprayed in such a spray amount that causes cracking upon collision of the abrasive agent against the flashes 116 and 117.

Figure 3B:
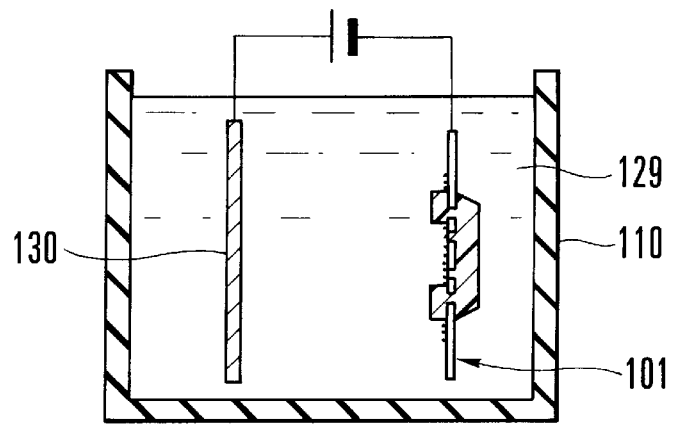

After the abrasive agent-mixed water W is sprayed to the lead frame 101, the lead frame 101 is subjected to the electrolytic process. More specifically, as shown in FIG. 3B, the lead frame 101 is dipped in an electrolytic solution 129 in an electrolytic cell 110, and a DC voltage is applied across the lead frame 101 and a plate-like carbon electrode 130 such that the lead frame 101 becomes the cathode.

When the lead frame 101 is subjected to the electrolytic process, the electrolytic solution 129 permeates into it through the cracks formed in its flashes 116 and 117 to come into contact with the lead frame 101 on the lower side of the flashes 116 and 117. Then, bubbles are generated in the entire regions of portions of the lead frame 101 to which the flashes 116 and 117 attach. Even if the flashes 116 and 117 are thick, they are substantially entirely separated from the lead frame 101 or attach to it only slightly in the electrolytic process step described above.

Figure 3C:
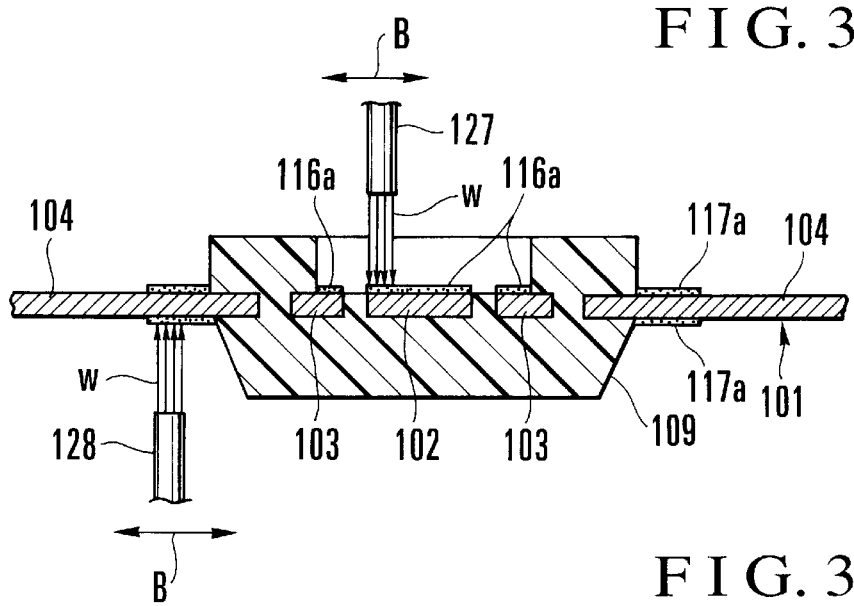

After the electrolytic process, the lead frame 101 is supplied to the flash removing apparatus 121 again, and the abrasive agent-mixed water W is sprayed to the entire upper and lower surfaces of the lead frame 101. In this second convey step, the convey speed of the lead frame 101 is controlled by the controller 124 to be lower than in the first convey step. More specifically, the spray amount of abrasive agent-mixed water W in the second convey step is larger than that in the first convey step. FIG. 3C shows a state wherein the abrasive agent-mixed water W is sprayed to the lead frame 101 in the second convey step.

While the spray amount of abrasive agent-mixed water W is controlled in this manner, when the lead frame 101 is conveyed from the upstream end portions of the upstream belt conveyors 126a and 126b to the downstream end portions of the downstream belt conveyors 129a and 129b, flashes 116a and 117a remaining in the electrolytic process step and shown in FIG. 3C are entirely removed. Thereafter, the lead frame 101 unloaded from the downstream belt conveyors 129a and 129b is washed with running water and further washed with a stock solution of alcohol.

When the lead frame 101 is washed with the stock solution of alcohol, water that has attached to the lead frame 101 in the previous step is replaced with alcohol, and the replacing alcohol is evaporated to dry the lead frame 101. When washing the lead frame 101 with the stock solution of alcohol, the lead frame 101 may be dipped in a tank containing a stock solution of alcohol, or the lead frame 101 may be exposed to a running stock solution of alcohol.

After flash removal from the lead frame 101 is ended, a bonding step of bonding a chip 118, a wire bonding step, a cap adhering step, and an outer lead cutting and bending step are performed in the same manner as in the conventional case, thereby forming an ultra-high frequency device.

According to this embodiment, when removing the flashes 116 and 117 formed on the surfaces of the lead frame 101, if the scheme is employed in which the abrasive agent-mixed water W is sprayed to the molded lead frame 101 and thereafter the lead frame 101 is subjected to the electrolytic process, then cracks are formed in the flashes 116 and 117 before the electrolytic process is performed. When the cracks are formed, the electrolytic solution 129 permeates into the cracks in the electrolytic process step to come into contact with the lead frame 101 on the lower side of the flashes 116 and 117, thereby generating bubbles on the entire regions of portions where the flashes 116 and 117 are formed.

Even if the flashes 116 and 117 are thick, they are substantially entirely separated from the lead frame 101 or attach to it only slightly in the electrolytic process step described above. In the step of spraying the abrasive agent-mixed water W after the electrolytic process step, even if the spray amount is small, the flashes 116 and 117 can be entirely, completely removed. In other words, the external force which is applied to the lead frame 101 to remove the flashes 116 and 117 can be small.

After the second convey step, when the scheme is employed in which the lead frame 101 is washed with the stock solution of alcohol and dried, even if water is used to remove the flashes 116 and 117, the lead frame 101 can be dried without using a drier.

Furthermore, the flash removing apparatus 121 has the convey unit 122, the injection unit 123, and the controller 124. The convey unit 122 conveys the lead frame 101 molded integrally with the case 109 in a direction parallel to the major surface of the lead frame 101. The injection unit 123 sprays the abrasive agent-mixed water W to the lead frame 101 which is being conveyed by the convey unit 122. The controller 124 controls the spray amount of abrasive agent-mixed water W by changing the lead frame convey speed of the convey unit 122. Therefore, the spray amount of abrasive agent-mixed water W can be controlled while maintaining the flow rate of abrasive agent-mixed water W sprayed from the injection unit 123 to the optimum constant value with which the abrasive agent will not stay in the pipe.

The method has been described above wherein after the electrolytic process is performed, the abrasive agent-mixed water W is sprayed to the lead frame 101 again. Since the flashes 116 and 117 can be removed more easily in the electrolytic process step than with the conventional scheme, the abrasive agent need not be used in this second spray step. After the electrolytic process step, ultrasonic cleaning may be performed in place of spraying the abrasive agent-mixed water W.

The flash removing apparatus 121 need not spray the abrasive agent-mixed water W to the both upper and lower surfaces of the lead frame 101, but can spray the abrasive agent-mixed water W only from above. In this latter case, after one surface of the lead frame 101 undergoes the spray process, the lead frame 101 is reversed automatically or manually, and the other surface of the lead frame 101 is subjected to the spray process. In this case, the arrangement of the convey unit 122 can be the same as that shown in FIGS. 1 and 2. With this arrangement, the abrasive agent-mixed water W is not sprayed upward. Therefore, a scattering preventive cover need not be formed above the nozzles, thus obtaining a small flash removing apparatus.

Practical numerical data on the flash removing apparatus 121 of the embodiment described above will be shown. The diameter of the upper and lower nozzles 127 and 128 is 12 mm, and the pressure of the abrasive agent-mixed water W supplied to the nozzles 127 and 128 is 2.0 kg/cm$^2$. To prepare the abrasive agent-mixed water W, a urea resin powder and an iron powder are mixed to form an abrasive agent, and this abrasive agent is mixed in water at a concentration of 20%. As the urea resin powder, one with a hardness of 3.5 Mohs, a specific gravity of 1.47 to 1.52, and a pH of 6 to 7 is used. The amount of iron powder is 0.05% at maximum in weight ratio.

When spraying the abrasive agent-mixed water W to the lead frame 101, the convey speed of the lead frame 101 conveyed by the convey unit 122 is 0.9 m/min in the first spray step and 0.7 m/min in the second spray step. As the electrolytic solution 129 for the electrolytic process, one obtained by mixing soda lye and a sodium cyanide in equal amounts is used. The electrolytic process is performed by dipping the lead frame 101 for 12 minutes in the electrolytic solution 129 heated to 50° C. At this time, the current density is 2 A/dM.

As has been described above, with the lead frame flash removing method and apparatus according to the present invention, a flash can be removed easily while shortening a time required for the electrolytic process without using a high-pressure blast finisher in a later step. Even a small, hollow package will not be blown off with the water pressure, leading to an improvement in yield.

Since a conventional large, expensive unit, e.g., a high-pressure blast finisher, becomes unnecessary, the space occupied by the flash removing apparatus can be small, and the cost of the flash removing step can be decreased. Also, a lead frame drier becomes unnecessary.

What is claimed is:

1. A lead frame flash removing method comprising the ordered steps of:

molding a lead frame integrally with a resin portion;

after molding, spraying abrasive agent-mixed water to a surface of said lead frame where a flash is formed;

dipping said lead frame in an electrolytic solution and applying a DC voltage across said lead frame and an electrode in said electrolytic solution, thereby electrolytically processing said lead frame; and after the electrolytic process, applying an external force to said surface of said lead frame where said flash is formed, thereby removing the flash.

2. A method according to claim 1, wherein the flash removing step comprises the step of spraying water to said surface of said lead frame.

3. A method according to claim 2, wherein the water to be sprayed to said surface of said lead frame is abrasive agent-mixed water.

4. A method according to claim 2, wherein an amount of the water sprayed to said lead frame after the electrolytic process is larger than an amount of the abrasive agent-mixed water sprayed to said lead frame before the electrolytic process.

5. A method according to claim 2, further comprising, after spraying said water to said surface of said lead frame, the step of washing said lead frame with alcohol and drying said lead frame.

6. A method according to claim 1, further comprising, after flash removal, the step of electrically connecting said lead frame and a chip.

* * * * *